United States Patent
Kieslinger et al.

(10) Patent No.: US 12,127,354 B2
(45) Date of Patent: Oct. 22, 2024

(54) CAR MODULE COMPRISING TAMPER DETECTION ELECTRONIC CONTROL UNIT

(71) Applicant: ZKW Group GmbH, Wieselburg (AT)

(72) Inventors: Dietmar Kieslinger, Theresienfeld (AT); Marion Schubert, Vienna (AT)

(73) Assignee: ZKW Group GmbH, Wieselburg (AT)

( * ) Notice: Subject to any disclaimer, the term of this patent is extended or adjusted under 35 U.S.C. 154(b) by 249 days.

(21) Appl. No.: 17/782,229

(22) PCT Filed: Nov. 12, 2020

(86) PCT No.: PCT/EP2020/081858
§ 371 (c)(1),
(2) Date: Jun. 3, 2022

(87) PCT Pub. No.: WO2021/121794
PCT Pub. Date: Jun. 24, 2021

(65) Prior Publication Data
US 2023/0010743 A1     Jan. 12, 2023

(30) Foreign Application Priority Data
Dec. 20, 2019 (EP) ..................... 19218583

(51) Int. Cl.
*H05K 5/02* (2006.01)
*B60R 16/02* (2006.01)
*H05K 7/14* (2006.01)

(52) U.S. Cl.
CPC ........... *H05K 5/0208* (2013.01); *B60R 16/02* (2013.01); *H05K 5/0217* (2013.01); *H05K 7/1427* (2013.01)

(58) Field of Classification Search
CPC ........ B60N 2/002; B60J 5/0416; B60K 35/10; B60R 16/02; B60R 21/01532;
(Continued)

(56) References Cited

U.S. PATENT DOCUMENTS

| 6,441,733 B1 * | 8/2002 | Unterschultz | G08B 29/08 340/572.8 |
|---|---|---|---|
| 2009/0058628 A1 * | 3/2009 | Kirmayer | G08B 15/00 340/501 |

(Continued)

FOREIGN PATENT DOCUMENTS

| DE | 19512266 A1 * | 3/1996 | ............. B60R 25/00 |
|---|---|---|---|
| EP | 2408286 A1 | 1/2012 | |
| WO | 2014170333 A2 | 10/2014 | |

OTHER PUBLICATIONS

International Search Report for PCT/EP2020/081858, dated Feb. 2, 2021 (15 pages).

(Continued)

*Primary Examiner* — Stephen R Burgdorf
(74) *Attorney, Agent, or Firm* — Eversheds Sutherland (US) LLP (57) ABSTRACT

The invention relates to a car module (10) comprising a tamper detecting electronic control unit (1), wherein the electronic control unit (1) is configured to control at least one electrically controllable function of a vehicle, for instance a light function such as low beam or high beam of a vehicle headlight, said electronic control unit (1) comprising—at least one carrier (2), in particular a printed circuit board, comprising an electric circuit (2*a*) for performing the controlling by the electronic control unit (1), —a housing (3) enclosing the at least one carrier (2), wherein the housing (3) comprises at least two parts (3*a*, 3*b*), wherein a first part (3*a*) of the housing (3) is holding the carrier (2), and wherein a second part (3*b*) of the housing (3) is attached to the first part (3*a*) in order to close the housing (3) and as such enclose the carrier (2) within the housing (3), and—a system (4) for detecting opening of the housing (3).

18 Claims, 8 Drawing Sheets

(58) Field of Classification Search
CPC ..... B60R 25/2027; E05B 81/76; E05B 81/78; H03K 17/955; H03K 17/96; H03K 17/962; H05K 5/0208; H05K 5/0217; H05K 7/1427
USPC ...................................................... 340/568.1
See application file for complete search history.

(56) References Cited

U.S. PATENT DOCUMENTS

| | | | |
|---|---|---|---|
| 2010/0037325 A1* | 2/2010 | Westerinen | H05K 1/141 |
| | | | 726/34 |
| 2016/0078752 A1* | 3/2016 | Vardi | H04B 1/385 |
| | | | 340/506 |
| 2017/0103632 A1* | 4/2017 | Tolle | H04W 12/06 |
| 2017/0262661 A1 | 9/2017 | Ming-Hsiung | |
| 2017/0316228 A1* | 11/2017 | Campbell | G06F 21/62 |
| 2017/0345269 A1* | 11/2017 | Schomacker | G08B 13/2431 |
| 2020/0194149 A1* | 6/2020 | Han | H01C 1/034 |

OTHER PUBLICATIONS

Search Report for European Patent Application No. 19218583.3 dated Jun. 29, 2020 (6 pages).

\* cited by examiner

CAR MODULE COMPRISING TAMPER DETECTION ELECTRONIC CONTROL UNIT

FIELD OF THE INVENTION AND DESCRIPTION OF PRIOR ART

The invention relates to a car module. Moreover, the invention also relates to a method for using a car module. The invention also relates to a vehicle headlight comprising a car module according to the invention.

Furthermore, the invention relates to a method for using a car module according to the invention.

Car modules that comprise electronic control units are known to control a plurality of car functionalities like controlling switching of light modules of a vehicle headlight, changing the light pattern of such light modules, or controlling functions of the engine or electrical parts of a vehicle like actuators for opening windows etc. Usually, these functions are not controlled by a single car module but a number of car modules which are configured to control a specific number of functions.

For the sake of waterproofness and durability reasons, car modules usually comprise a housing that encloses the electronic parts of the car module thus protecting the electronic parts from water, dust, mechanical impacts etc.

It is well known that many car modules comprise housings that comprise two parts, wherein one part is fixed to another for example by way of a screwing connection. Removal of the screwing connection allows access to the electronic parts of such a car module. Such access can be desirable—for instance when replacing parts of the car module or when checking for errors or accessing data stored on the electronic parts or connecting additional electronic parts to the car module. As such, a car module is also prone to manipulation. Such manipulation can be in line with requirements of the car manufacturer—for instance by changing software settings, electronic components or by adding additional components—in the event that these manipulations are performed by the car manufacturer themselves or are executed according to specific requirements of the car manufacturer and performed by legally authorized persons skilled in the art. Such manipulations are known from prior art and can be in the interest of a car manufacturer, for instance in order to access additional functionalities of a vehicle that can be activated upon additional payment.

However, manipulations can also take place without the consent of the car manufacturer. Such manipulations can include illegal amendments to the performance of the power train, change of electrical settings of the vehicle, access key material stored on the car module, access PII (personally identifiable information), etc. In recent times, vehicle driver assistance systems are quickly developing and partially already taking over driving commands. Manipulations of such car modules can bear a great safety risk for the driver of a manipulated car as well as for other traffic participants. Car modules related to such driving assistance functions and/or autonomous driving functions thus have to meet highest reliability and security requirements.

It is therefore an object of the present invention to provide a car module that allows increased security of a vehicle function implemented on a car module.

SUMMARY OF THE INVENTION

This object is achieved by way of a car module that comprises according to the invention a tamper detecting electronic control unit, wherein the electronic control unit is configured to control at least one electrically controllable function of a vehicle, for instance a light function such as low beam or high beam of a vehicle headlight, said electronic control unit comprising at least one carrier, in particular a printed circuit board, comprising an electric circuit for performing the controlling by the electronic control unit, a housing enclosing the at least one carrier, wherein the housing comprises at least two parts, wherein a first part of the housing is holding the carrier, and wherein a second part of the housing is attached to the first part in order to close the housing and as such enclose the carrier within the housing, and a system for detecting opening of the housing, wherein the system for detecting opening of the housing comprises the following:

a first electrode arranged on the carrier, a second electrode arranged on the carrier or on the housing, said second electrode being spaced apart from the first electrodes, electric relevant material that is initially distributed at least partially randomly between the first and second electrode, wherein the distribution of said material affects at least one electric parameter measurable between the first and second electrode, said initial distribution of the electric relevant material being in the following referred to as car module individual initial finger print, wherein the electric relevant material is mechanically connected at least to the second part of the housing in a manner that removal of the second part of the housing affects the distribution of the electric relevant material between the first and the second electrode, thus turning the car module individual initial finger print into a manipulated finger print, and a tamper detection unit connected to the electric circuit, wherein the tamper detection unit is configured to measure and store a car module unique value of the electric parameter, in particular electrical resistance, impedance and/or capacity, measured between the first and the second electrode and associated with the car module individual initial finger print, wherein the car module unique value serves as a reference value, said reference value representing the initial distribution of the electric relevant material, and wherein the tamper detection unit is furthermore configured to measure at least at every start-up of the electronic control unit the actual value of the electric parameter measured between the first and the second electrode, namely a real value, and wherein the tamper detection unit is configured to evaluate differences between the real value and the reference value in order to detect tampering of the housing and as such tampering of the electronic control unit.

The electric relevant material can be any kind of material that allows generating a car module individual finger print that will change as a result of manipulation in a manner that an electrical parameter measured between the first and the second electrode will change as a result of the manipulation.

Measurement of the real value can take place not only at every start-up of the electronic control unit (also referred to as ECU) but also during its operation. As such, manipulation during operation will also be detected.

By way of the present invention opening of the housing can be reliably detected. Such opening is interpreted as a tampering attempt, i.e. a manipulation, and the car module can be set into a safe/secure state, for instance allowing still operation of a car function, but in a limited range with increased safety features. For example, once tampering was noticed, a vehicle headlight can be put into a safe basic condition, simply emitting a low beam distribution without using higher intensity high beam functions or segment light functions which could cause glare if used incorrectly.

Same applies for instance on car assistance systems or autonomous driving systems—after detection of tampering these systems can be put into a state of higher safety and security and limited functionality—for instance by decreasing the maximum speed of the car and alerting other safety systems.

In other words, the present invention allows non-destructive detection of tampering and putting the tampered car module into a safe state of operation. The two parts of the housing can also be permanently fixed to another by adhesive or for instance by welding. Therefore, the term "two parts" does not mean that these parts have to be configured to be separated from each other.

In particular, the tamper detection unit can be configured to emit a verification signal in the event that the real value is within a predefineable range with regard to the reference value, wherein the electronic control unit is configured to receive the verification signal of the tamper detection unit upon start of the electronic control unit, wherein in absence of the verification signal (which also includes the presence of a failure signal) the electronic control unit is configured to initiate a failure routine. Such a failure routine could comprise deactivating the function of the ECU, sending a manipulation message to the driver screen, issuing a security warning, putting the ECU back into a safe state with limited functionality, etc.

Advantageously, the at least parts of the first and second electrode are shaped in a fork-like configuration. This allows low cost manufacturing while providing sufficient manipulation sensitivity of the finger print.

Preferably, at least parts of the first and second electrode are shaped in a star-like configuration. This allows an increased manipulation sensitivity of the finger print.

Since the electrodes can comprise different parts, the above-mentioned electrode configurations can also be combined based on different parts that can be connected to each other.

The second electrode can also be arranged on the at least one carrier. This allows easier production of the electrode configuration since both electrodes can be prearranged and manufactured during production or assembling of the carrier. Such a carrier could be realized as a PCB.

By way of alternative the second electrode can also be arranged on the housing, in particular by way of a component of the housing or the physical structure of the housing itself. As such, manipulation of the housing, in particular attempts of bending or physically breaking parts of the housing, will damage the electrode and hence have a strong impact on the finger print of the car module. Of course, the second electrode has to be connected in this case with the system, in particular the ECU, by way of an electric connection.

Preferably, the first and the second electrode each comprise a number of locally distributed electrode sub-groups, wherein the locally distributed electrode sub-groups of each electrode are associated and electrically connected either with the first electrode or the second electrode, wherein some electrode sub-groups are distributed on an upper side of the carrier and other electrode groups are distributed on an opposing lower side of the carrier. Hence, parts of the car module individual finger print can be arranged on the upper and other parts can be arranged on the lower side of the carrier. Hence, manipulation from each side of the carrier is detectable.

In order to reduce the amount of electrical relevant material needed or in order to increase the mechanical stability of the connection of the housing with the carrier, in particular in the region of the car module individual finger print, the housing can furthermore comprise at least one protrusion extending towards a section of the carrier comprising at least a part of the first electrode, wherein electric relevant material is distributed between the protrusion and at least a part of the first electrode, physically contacting at least the protrusion. Therefore, the protrusion can basically rest on the finger print and secure a safe fit of the housing with regard to the finger print. Another advantage of this embodiment is that the distance between the electrodes can be reduced and the values of the relevant parameters will be higher, thus yielding an increased sensitivity.

The electric relevant material can comprise dielectric material. The distribution of the dielectric material will influence the capacity measured between the first and the second electrode. As such, it will also affect the capacitive impedance between the electrodes.

Additionally, or by way of alternative the electric relevant material can comprise adhesive. An adhesive is a glue for mechanically fixing an object or material. The adhesive can be electrically non-conductive or electrically conductive. Adding adhesive material to the electric relevant material or realizing the electric relevant material as an adhesive enables to realize a "sticky" finger print, that will partially break and deteriorate in case of manipulation.

Additionally, or by way of alternative the electric relevant material can be at least partially electrically conductive. A such, the ohmic resistance (or admittance) measured between the two electrodes can serve as an electrical relevant parameter.

The first and second electrodes can be covered with an isolating layer. By virtue of this feature the ohmic resistance between the electrodes is highly increased, thus allowing for instance enhanced sensibility with regard to capacity measurements.

By way of alternative, the first and second electrodes are directly in contact with the electrical relevant material with no separation layer in between. By virtue of this feature the ohmic resistance between the electrodes is sufficient low to serve as a relevant parameter P.

The invention also relates to a vehicle headlight comprising a car module according to the invention.

Furthermore, the invention relates to a method for using a car module according to the invention, wherein during the manufacture and configuration process of the car module a setup procedure is executed for determining the initial finger print and saving the corresponding reference value in the car module and in a memory that is separated from the car module. Consequently, each car module can be tracked back based on measuring its individual finger print—even back to its specific manufacturing date, place and time by way of measuring the finger print. Such a measurement is proof of manipulation since an initial finger print cannot be changed without being detected by the ECU. Car module individual parameters, e.g. a serial number, can be related to said initial finger print. Data regarding the initial finger print could also be stored on a non-erasable memory.

In order to take into account potential aging of the finger print and thus change of the respective reference value of the respective electrical parameters it can also be envisaged that in the event that no tampering was detected upon start of the electronic control unit the measured real value is stored and replaces the preceding initial reference value. Thus, the reference value can float in line with the level of the aging effect. For instance, a change of the electric value by 10% or higher can be interpreted as a result of manipulation. However, a change of 1% could be caused by aging effects or temperature drifts. As such, a new measured value that amounts to 99% of the initial reference value can be set as a new reference value. A predefineable limit of a maximum allowable difference of the real value with regard to the reference value can be set, for instance 2%. Thus, by updating the reference value with every start-up, aging effects that can cause differences of 10% or more, could be filtered and would not cause any failure notice since such aging will accumulate over time and a high number of start-ups, thus rendering the change between each start-up for instance below 1%. By way of alternative also an aging curve could be estimated for the reference value and/or the time difference or temperature difference could be measured between the present and the last start-up in order to estimate an expected difference in reference and real value.

BRIEF DESCRIPTION OF THE DRAWINGS

In the following, in order to further demonstrate the present invention, illustrative and non-restrictive embodiments are discussed, as shown in the drawings, which show:

FIG. 1a a schematic cross-sectional view of a car module according to the invention, FIG. 1b a detail of FIG. 1a regarding electrical relevant material disposed between the housing and the electrodes, FIG. 2a to FIG. 2d the arrangement of FIG. 1b with different compositions of electric relevant material and arrangement of electrodes, FIG. 3a to FIG. 3c an exemplary event of manipulation of a finger print, FIG. 4a and FIG. 4b different electrode configurations, FIG. 5a and FIG. 5b exemplary at least partially randomized distributions of electric relevant material on the electrodes, FIG. 6 an exemplary layout of functional blocks of a tamper detection unit, FIG. 7 an exemplary view of a finger print of a car module, FIG. 8a a schematic cross-sectional view of a car module according to the invention, wherein the housing comprises protrusions, and FIG. 8b a detail of FIG. 8a regarding electrical relevant material disposed between the housing and the electrodes.

DETAILED DESCRIPTION OF EMBODIMENTS OF THE INVENTION

In the following, identical reference signs used in the figures depict identical features if not stated otherwise.

Figure 1A:
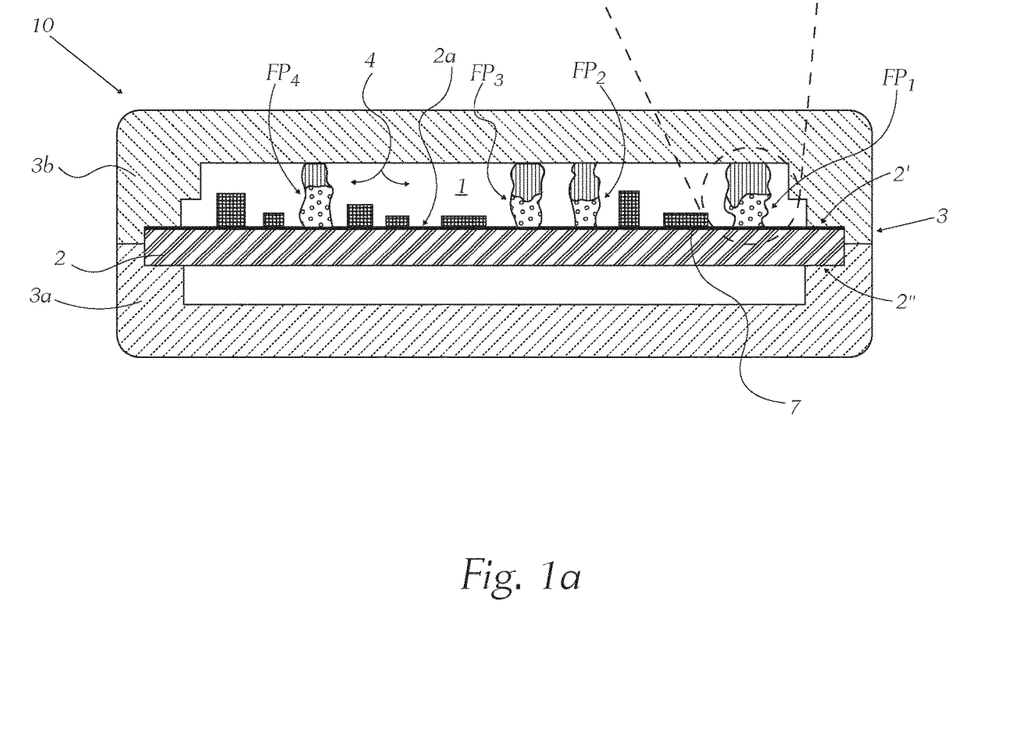

FIG. 1a shows a schematic cross-sectional view of a car module 10 according to the invention. The car module 10 comprises a tamper detecting electronic control unit 1, wherein the electronic control unit 1 is configured to control at least one electrically controllable function of a vehicle, for instance a light function such as low beam or high beam of a vehicle headlight.

The electronic control unit 1 comprises at least one carrier 2, in particular a printed circuit board, comprising an electric circuit 2a for performing the controlling by the electronic control unit 1. Moreover, the electronic control unit also comprises a housing 3 enclosing the carrier 2. The housing 3 comprises at least two parts 3a, 3b. A first part 3a of the housing 3 is holding the carrier 2 and a second part 3b of the housing 3 is attached to the first part 3a in order to close the housing 3 and as such enclose the carrier 2 within the housing 3.

Figure 1B:
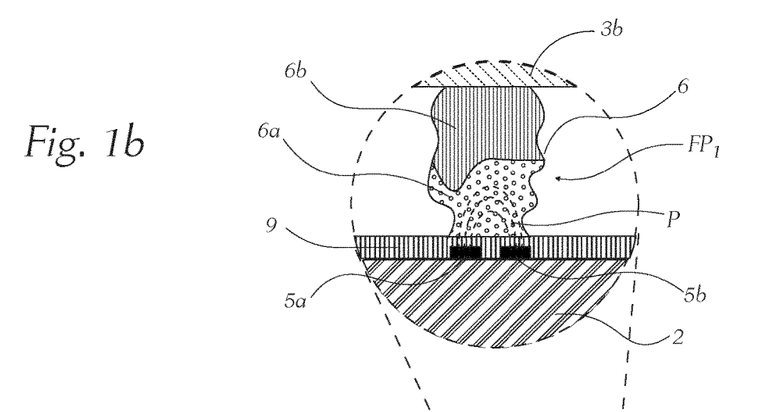

Furthermore, the electronic control unit 1 comprises a system 4 for detecting opening of the housing 3. With view on FIG. 1b, it is denoted that this system 4 comprises a first electrode 5a arranged on the carrier 2, a second electrode 5b arranged on the carrier 2 or on the housing 3, said second electrode 5b being spaced apart from the first electrodes 5a and electric relevant material 6 that is initially distributed at least partially randomly between the first 5a and second electrode 5b. The distribution of said material 6 affects at least one electric parameter P measurable between the first and second electrode 5a, 5b, said initial distribution of the electric relevant material 6 being in the following referred to as car module 10 individual initial finger print FP. FIG. 1b shows one detail $FP_1$ of the finger print FP. The finger print FP as such is determined based on the sum of all the local finger prints, for instance $FP_1$, that are connected to the same electrodes. Thus, distribution of a number of local finger prints and connecting into one global finger print FP allows for a higher randomization of the finger print and higher security standards since the manipulation detection is also more likely to detect partial opening of the housing 3.

Figure 3A:
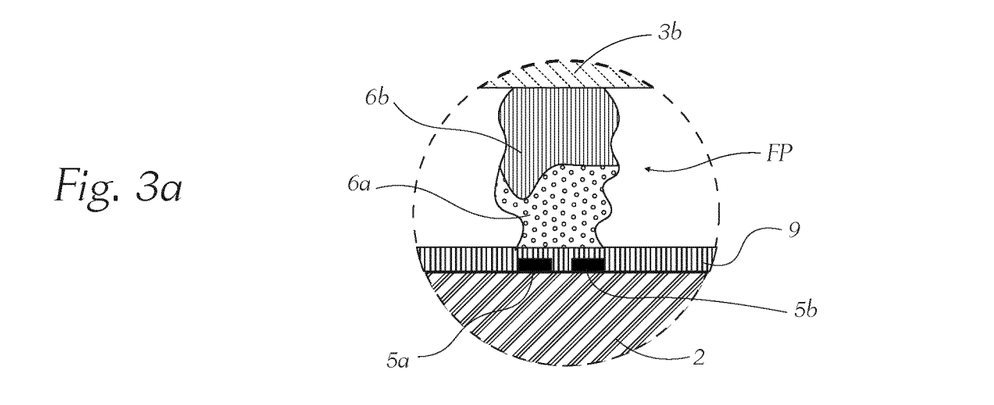
Figure 3B:
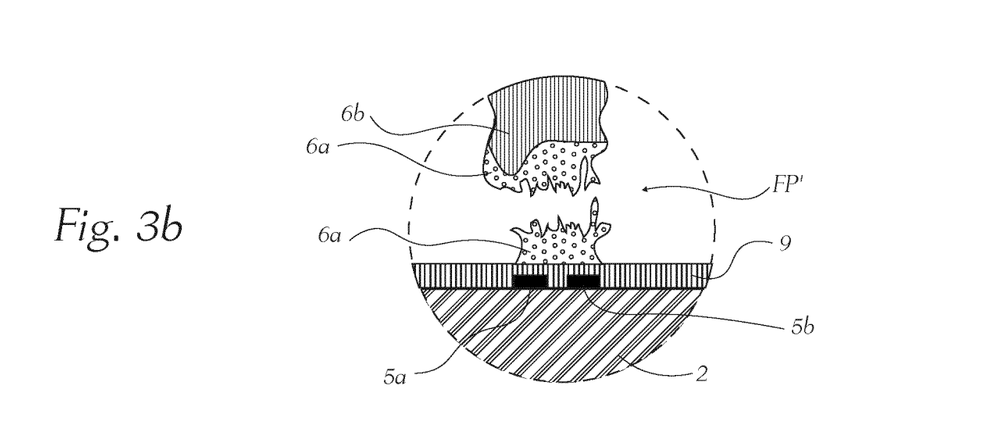
Figure 3C:
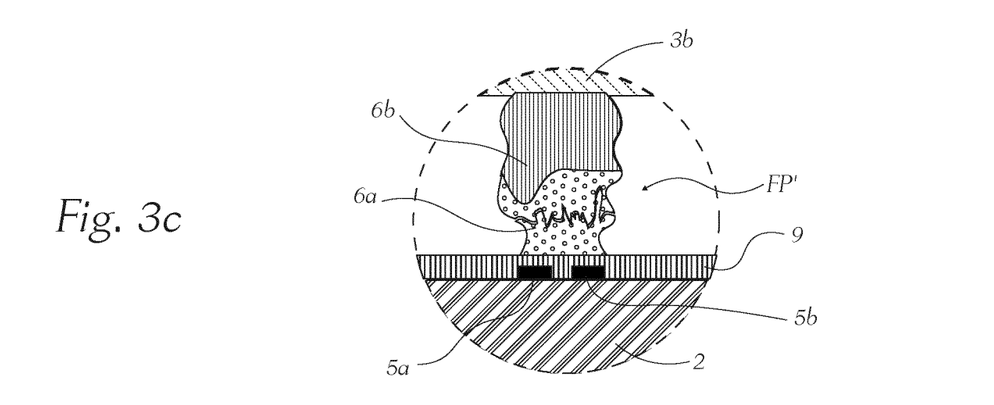

The electric relevant material 6 is mechanically connected at least to the second part 3b of the housing 3 in a manner that removal of the second part 3b of the housing 3 affects the distribution of the electric relevant material 6 between the first 5a and the second electrode 5b, thus turning the car module 10 individual initial local finger prints $FP_1$ to $FP_4$ (see FIG. 1a), and in sum the overall finger print FP, into a manipulated finger print FP' (see FIGS. 3b and 3c).

The system 4 further comprises a tamper detection unit 7 (for details see FIG. 6), that is connected to the electric circuit 2a, wherein the tamper detection unit 7 is configured to measure and store a car module 10 unique value of the electric parameter P, in particular electrical resistance, impedance, inductivity and/or capacity, measured between the first 5a and the second electrode 5b and associated with the car module 10 individual initial finger print FP. The measurement of the parameter P can be for instance within a range of a few kHz up to a number of MHz which will lead for instance to capacities in the range of 0.1 to 100 pF, in particular 5 to 20 pF. The car module 10 unique value serves as a reference value $V_{ref}$, said reference value $V_{ref}$ representing the initial distribution of the electric relevant material 6. The tamper detection unit 7 is furthermore configured to measure at least at every start-up of the electronic control unit 1 the actual value of the electric parameter measured between the first 5a and the second electrode 5b, namely a real value $V_{real}$. The tamper detection unit 7 is configured to evaluate differences between the real value $V_{real}$ and the reference value $V_{ref}$ in order to detect tampering of the housing 3 and as such tampering of the electronic control unit 1.

The electric relevant material 6 disclosed in FIG. 1b is for instance electrically conductive adhesive 6a (for instance by mixing electrically conductive particles with non-conductive adhesive). In this embodiment, this adhesive 6a is covered with an electrically non-conductive adhesive 6b that allows mechanical fixation to the upper part of the housing 3b. This electrical non-conductive adhesive can be made of dielectric material. As will be discussed later on, choice of the electric relevant material will affect the finger print FP and the value of the parameters related to the finger print FP.

Figure 2A:
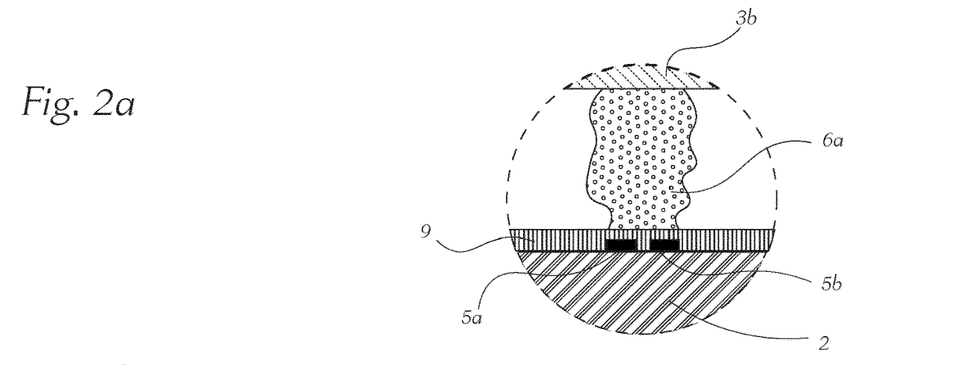
Figure 2B:
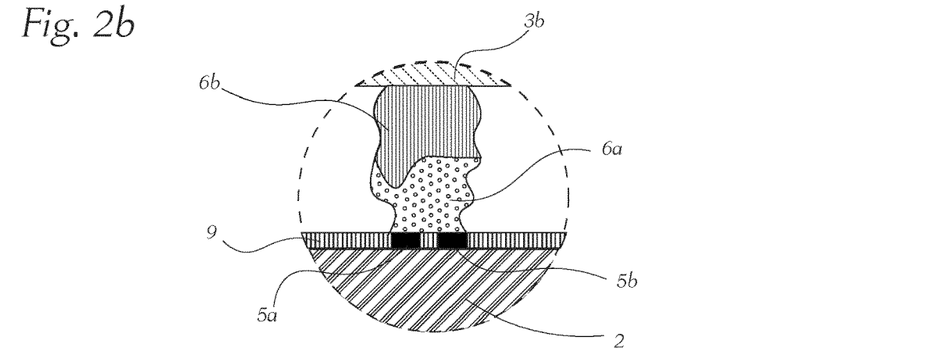
Figure 2C:
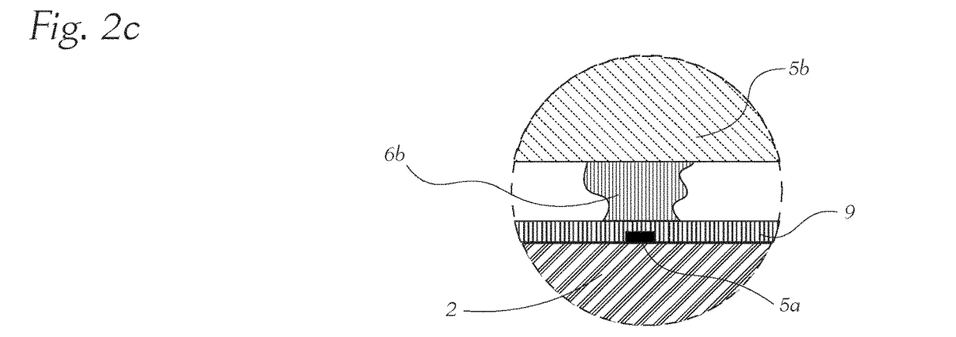
Figure 2D:
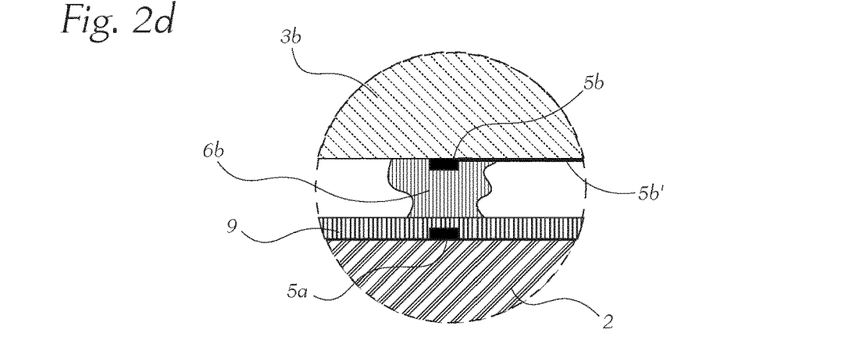

FIG. 2a to FIG. 2d show the arrangement of FIG. 1b with different compositions of electric relevant material 6 and different arrangement of electrodes 5a and 5b. FIG. 2a shows a configuration, wherein only electrically conductive adhesive 6a is applied as electrical relevant material. Both electrodes 5a and 5b are arranged on the carrier 2 and covered with an insulating layer 9. FIG. 2b shows a configuration that is basically similar to FIG. 1b with one exception: The electrodes 5a and 5b are not covered by an insulating layer 9 and thus directly contact the electrically conductive adhesive 6a. As such, the ohmic resistance between the electrodes 5a and 5b will be highly reduced depending mostly on the distribution and composition of the electrically conductive adhesive 6a resulting in a reliably parameter for manipulation detection. FIG. 2c shows a configuration wherein the housing 3 itself serves as second electrode 5b. In this case, the housing 3 has to comprise electrically conductive material and has to be in electrical contact with the system 4, in particular with the tamper detection unit 7. It is favourable when the housing is in this case not electrical connected with ground potential but has floating potential instead in order to avoid electrical influence of components which are not related to the car module itself. An electrically non-conductive adhesive 6b is applied between the two electrodes 5a and 5b. Lastly, FIG. 2d shows a variant wherein the second electrode 5b is applied on the housing 3. In this case, the housing 3 itself can be electrically non-conductive. The second electrode 5b has to be connected to the tamper detection unit 7 and for this purpose comprises a connection part 5b' that extends towards the tamper detection unit 7.

FIG. 3a to FIG. 3c show an exemplary event of manipulation of a finger print FP. The finger print FP of FIG. 3a is also referred to as initial finger print, i.e. the finger print that has been originally applied by the manufacturer of the car module 10. This finger print FP is associated with a specific value of an electric parameter P as discussed before resulting in a reference value $V_{ref}$. FIG. 3b shows the effect of opening the housing 3, i.e. removal of the upper part 3b from the lower part 3a. The electrically conductive adhesive 6a, that has weaker mechanical strength than the electrically non-conductive adhesive 6b, is torn into two parts, thus affecting the electrical parameter measured between the electrodes 5a and 5b. This results in a manipulated finger print FP' that differs from the initial finger print FP. This difference is also measurable by comparing the real value $V_{real}$ of the electric parameter P with the reference value $V_{ref}$. Even in case that the housing 3 is properly closed according to FIG. 3c, the distribution of the electrically conductive adhesive 6a will remain different from its original distribution according to FIG. 3a thus resulting in a real value $V_{real}$ that is significantly different from the reference value $V_{ref}$. Consequently, manipulation of the housing 3 will be detected by the electronic control unit 1.

Figure 4A:
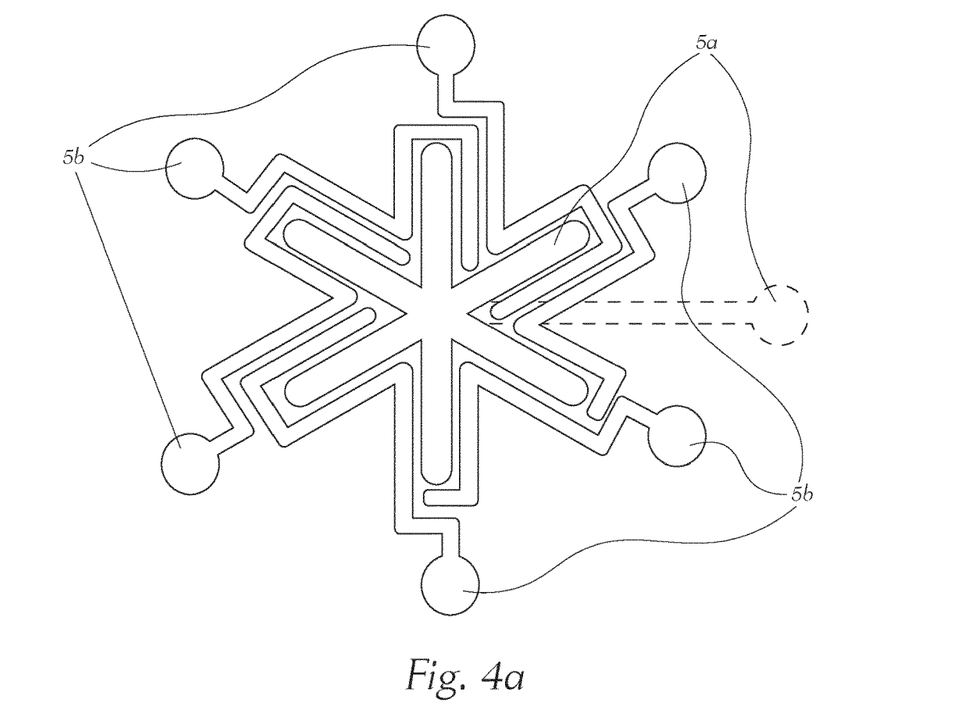
Figure 4B:
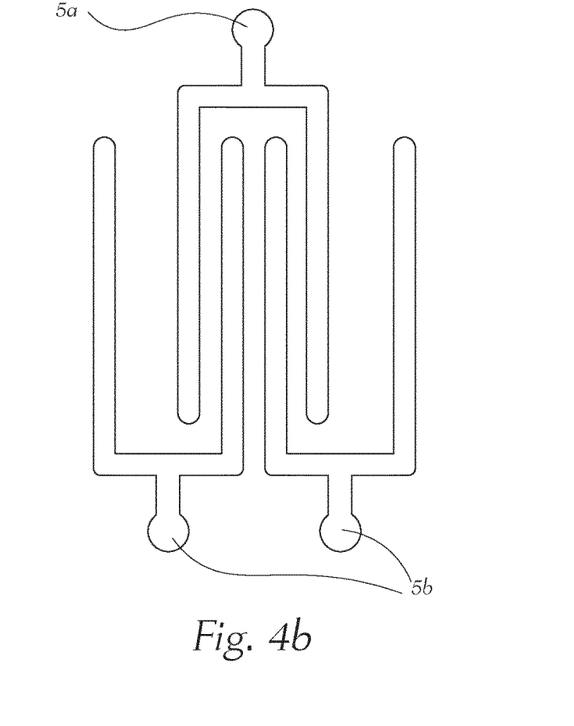
Figure 5A:
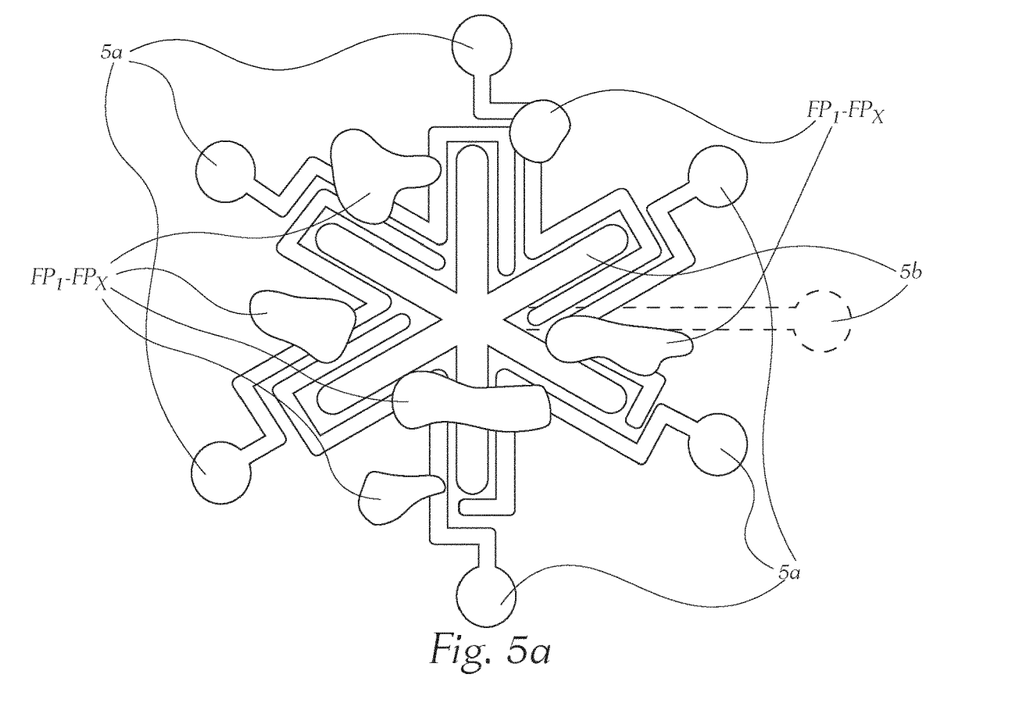
Figure 5B:
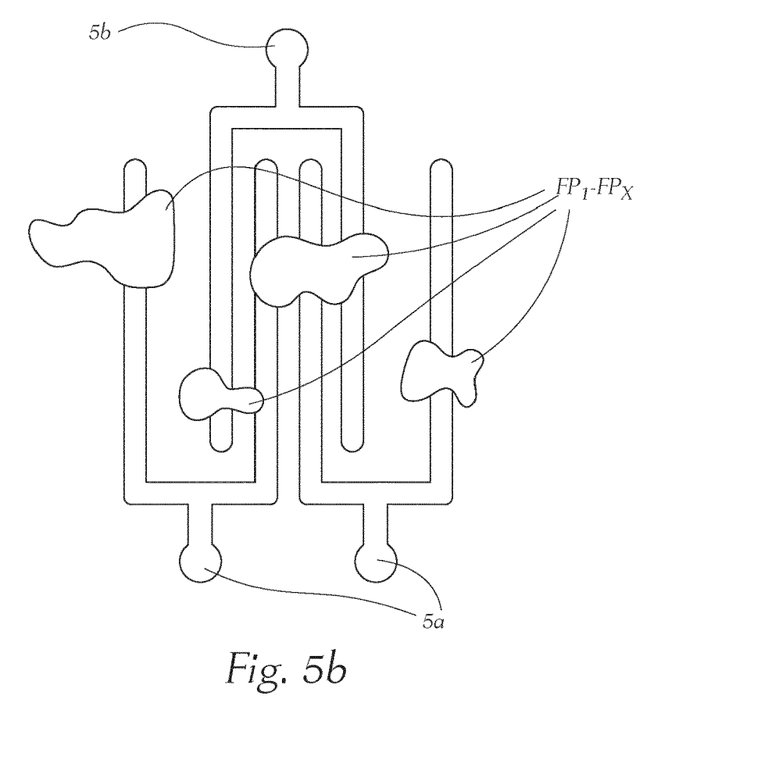

FIG. 4a and FIG. 4b show different electrode configurations. FIG. 4a shows a star-shaped configuration whereas FIG. 4b shows a fork-shaped configuration. FIG. 5a and FIG. 5b show exemplary at least partially randomized distributions of electric relevant material 6 on the electrodes, thus resulting in a number of local finger prints $FP_1$ to $FP_x$.

Figure 6:
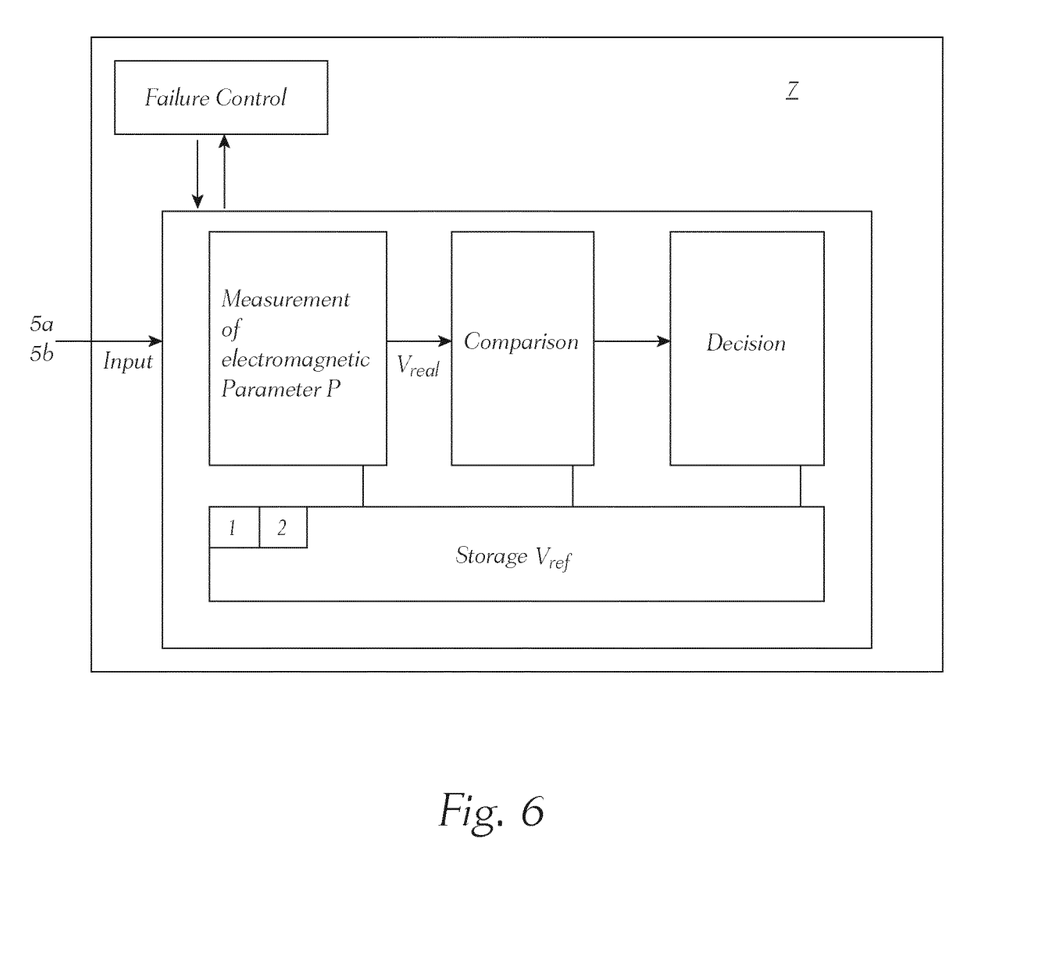

FIG. 6 shows an exemplary layout of functional blocks of a tamper detection unit 7 for detection of opening of a housing 3. Such a tamper detection unit 7 will be connected with the electrodes 5a and 5b and measure at least one electrical parameter P, compare the values $V_{ref}$ and $V_{real}$ and determine based on this comparison if a manipulation has taken place. In the event that manipulation is detected a manipulation control routine can be triggered. In particular, the tamper detection unit 7 can be configured to emit a verification signal in the event that the real value $V_{real}$ is within a predefineable range with regard to the reference value $V_{ref}$, wherein the electronic control unit 1 is configured to receive the verification signal of the tamper detection unit 7 upon start of the electronic control unit 1, wherein in absence of the verification signal the electronic control unit 1 is configured to initiate a failure routine. Such a failure routine can comprise deactivating the function of the ECU, sending a warning message to the driver screen, sending a security warning, putting the ECU back into a safe state with limited functionality, etc.

Figure 7:
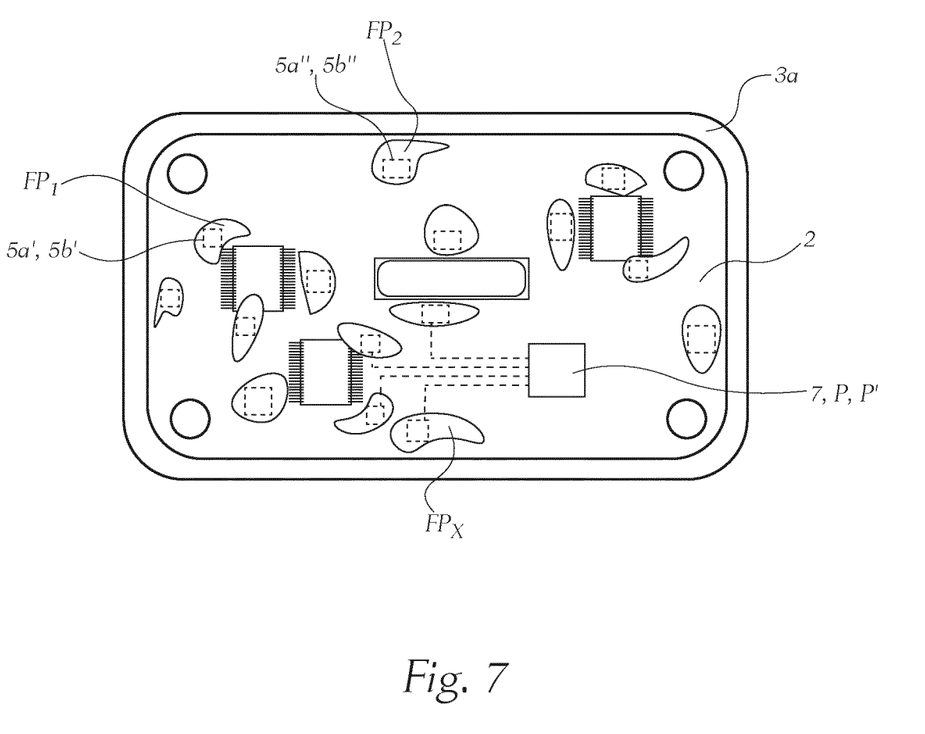

FIG. 7 shows an exemplary view of a number of local finger prints $FP_1$ to $FP_x$ arranged on a car module 10. For the sake of easier view, the housing 3 is not shown. Of course, these finger prints are connected with the housing 3. These finger prints are covering the electrodes 5a and 5b, which comprise a number of locally distributed electrode sub-groups 5a', 5a'', 5b', 5b'' etc., which are schematically indicated in FIG. 7 by a rectangular shaped dotted line. The locally distributed electrode sub-groups of each electrode are associated and electrically connected either with the first electrode 5a or the second electrode 5b. Although in the present figures all the electrodes are arranged on the upper side 2' of the carrier 2, the electrodes and finger prints can also be distributed on an opposing lower side 2'' of the carrier 2.

Figure 8A:
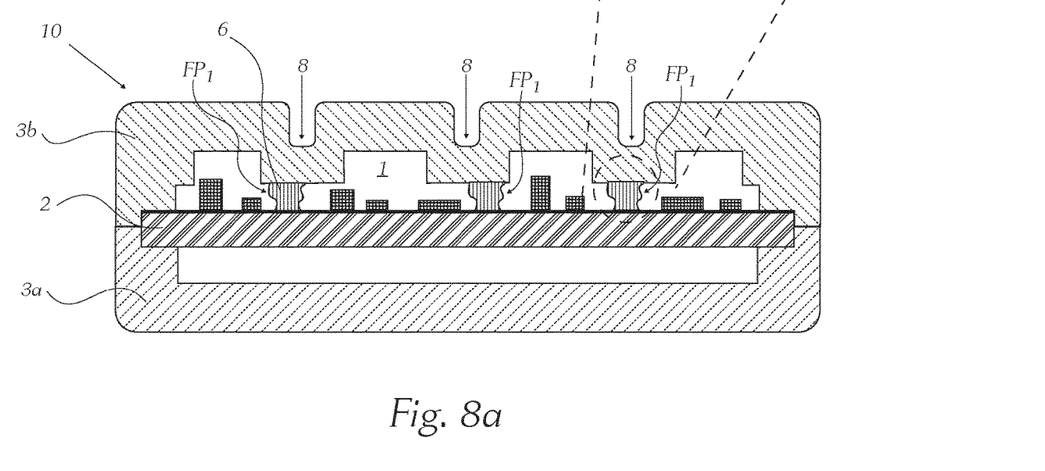
Figure 8B:
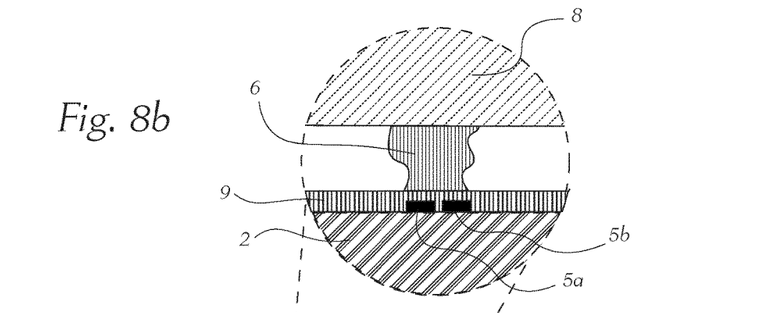

FIG. 8a shows a schematic cross-sectional view of a car module 10, wherein the housing comprises protrusions 8 extending towards a section of the carrier 2 comprising at least a part of the first electrode 5a (see FIG. 8b), wherein electric relevant material 6 is distributed between the protrusion 8 and at least a part of the first electrode 5a, physically contacting at least the protrusion 8.

The invention also relates to a vehicle headlight (not shown in the figures) comprising a car module 10 according to the invention.

Furthermore, the present invention also relates to a method for using a car module 10 according to the invention, wherein during the manufacture and configuration process of the car module 10 a setup procedure is executed for determining the initial finger print FP and saving the corresponding reference value in the car module 10 and in a memory that is separated from the car module 10. In the event that no tampering was detected upon start of the electronic control unit 1 the measured real value can be stored and replaces the preceding initial reference value.

Of course, the invention is not limited to the examples given in this specification. The scope of protection is outlined by the claims that follow.

The invention claimed is:

1. A vehicle headlight comprising a car module (10) comprising a tamper detecting electronic control unit (1), wherein the electronic control unit (1) is configured to control at least one electrically controllable function of a vehicle, said electronic control unit (1) comprising:

at least one carrier (2) comprising an electric circuit (2a) for performing the controlling by the electronic control unit (1);

a housing (3) enclosing the at least one carrier (2), wherein the housing (3) comprises at least two parts (3a, 3b), wherein a first part (3a) of the housing (3) is holding the carrier (2), and wherein a second part (3b) of the housing (3) is attached to the first part (3a) in order to close the housing (3) and as such enclose the carrier (2) within the housing (3); and a system (4) for detecting opening of the housing (3), wherein the system (4) for detecting opening of the housing (3) comprises:
   a first electrode (5a) arranged on the carrier (2),
   a second electrode (5b) arranged on the carrier (2) or on the housing (3), said second electrode (5b) being spaced apart from the first electrodes (5a),
   electric relevant material (6) that is initially distributed at least partially randomly between the first (5a) and second electrode (5b), wherein the distribution of said material (6) affects at least one electric parameter (P) measurable between the first and second electrode (5a, 5b), said initial distribution of the electric relevant material (6) being referred to as car module (10) individual initial finger print (FP), wherein the electric relevant material (6) is mechanically connected at least to the second part (3b) of the housing (3) in a manner that removal of the second part (3b) of the housing affects the distribution of the electric relevant material (6) between the first (5a) and the second electrode (5b), thus turning the car module (10) individual initial finger print (FP) into a manipulated finger print (FP'), and
   a tamper detection unit (7) connected to the electric circuit (2a), wherein the tamper detection unit (7) is configured to measure and store a car module (10) unique value of the electric parameter (P), in particular electrical resistance, impedance and/or capacity, measured between the first (5a) and the second electrode (5b) and associated with the car module (10) individual initial finger print (FP), wherein the car module (10) unique value serves as a reference value ($V_{ref}$), said reference value ($V_{ref}$) representing the initial distribution of the electric relevant material (6), and wherein the tamper detection unit (7) is furthermore configured to measure at least at every start-up of the electronic control unit (1) the actual value of the electric parameter measured between the first (5a) and the second electrode (5b), namely a real value ($V_{real}$), and wherein the tamper detection unit (7) is configured to evaluate differences between the real value ($V_{real}$) and the reference value ($V_{ref}$) in order to detect tampering of the housing (3) and as such tampering of the electronic control unit (1).

2. The vehicle headlight according to claim 1, wherein the tamper detection unit (7) is configured to emit a verification signal in the event that the real value ($V_{real}$) is within a predefineable range with regard to the reference value ($V_{ref}$), wherein the electronic control unit (1) is configured to receive the verification signal of the tamper detection unit (7) upon start of the electronic control unit (1), wherein in absence of the verification signal the electronic control unit (1) is configured to initiate a failure routine.

3. The vehicle headlight according to claim 1, wherein at least parts of the first (5a) and second electrode (5b) are shaped in a fork-like configuration.

4. The vehicle headlight according to claim 1, wherein at least parts of the first and second electrode are shaped in a star-like configuration.

5. The vehicle headlight according to claim 1, wherein the second electrode (5b) is also arranged on the at least one carrier (2).

6. The vehicle headlight according to claim 1, wherein the second electrode (5b) is arranged on the housing (3), in particular by way of a component of the housing (3) or the physical structure of the housing (3) itself.

7. The vehicle headlight according to claim 1, wherein the first (5a) and the second electrode (5b) each comprise a number of locally distributed electrode sub-groups (5a', 5a", 5b', 5b"), wherein the locally distributed electrode sub-groups of each electrode are associated and electrically connected either with the first electrode (5a) or the second electrode (5b), wherein some electrode sub-groups (5a', 5b') are distributed on an upper side (2') of the carrier (2) and other electrode groups (5a", 5b") are distributed on an opposing lower side (2") of the carrier (2).

8. The vehicle headlight according to claim 1, wherein the housing (3) furthermore comprises at least one protrusion (8) extending towards a section of the carrier (2) comprising at least a part of the first electrode (5a), wherein electric relevant material (6) is distributed between the protrusion (8) and at least a part of the first electrode (5a), physically contacting at least the protrusion.

9. The vehicle headlight according to claim 1, wherein the electric relevant material (6) comprises a dielectric material.

10. The vehicle headlight according to claim 1, wherein the electric relevant material (6) comprises an adhesive (6b).

11. The vehicle headlight according to claim 1, wherein the electric relevant material (6) is at least partially electrically conductive (6a).

12. The vehicle headlight according to claim 1, wherein the first and second electrodes (5a, 5b) are covered with an isolating layer (9).

13. The vehicle headlight according to claim 1, wherein the first and second electrodes (5a, 5b) are directly in contact with the electrical relevant material (6) with no separation layer in between.

14. A method for using a car module (10) according to claim 1, wherein during a manufacture and configuration process of the car module (10) a setup procedure is executed for determining the initial finger print (FP) and saving the corresponding reference value ($V_{ref}$) in the car module (10) and in a memory that is separated from the car module (10).

15. The method according to claim 14, wherein in the event that no tampering was detected upon start of the electronic control unit (1) the measured real value ($V_{real}$) is stored and replaces the preceding initial reference value ($V_{ref}$).

16. The vehicle headlight according to claim 1, wherein the at least one electrically controllable function of the vehicle comprises a light function.

17. The vehicle headlight according to claim 16, wherein the light function is a low beam or high beam of the vehicle headlight.

18. The vehicle headlight according to claim 1, wherein the at least one carrier (2) comprises a printed circuit board.

* * * * *